United States Patent [19]

Tomomura et al.

[11] Patent Number: 4,916,496
[45] Date of Patent: Apr. 10, 1990

[54] ZNS BLUE LIGHT EMITTING DEVICE

[75] Inventors: Yoshitaka Tomomura; Satoshi Yamaue, both of Nara; Masahiko Kitagawa, Tenri; Shigeo Nakajima, Nara, all of Japan

[73] Assignee: Sharp Corporation, Osaka, Japan

[21] Appl. No.: 256,125

[22] Filed: Oct. 6, 1988

Related U.S. Application Data

[63] Continuation of Ser. No. 2,802, Jan. 13, 1987, abandoned.

[30] Foreign Application Priority Data

Jan. 27, 1986 [JP] Japan ................................. 61-16408

[51] Int. Cl.⁴ ...................... H01L 33/00; H01L 29/22
[52] U.S. Cl. ......................................... 357/17; 357/16; 357/61
[58] Field of Search ............................. 357/61, 17, 16

[56] References Cited

U.S. PATENT DOCUMENTS

| | | | |
|---|---|---|---|
| 3,366,819 | 1/1968 | Crowder et al. | 357/61 |
| 3,385,731 | 5/1968 | Weimer | 357/61 |
| 4,197,552 | 4/1980 | Walker et al. | 357/17 |
| 4,386,295 | 5/1983 | Fujita et al. | 357/10 |
| 4,547,703 | 10/1985 | Fujita et al. | 313/509 |
| 4,594,282 | 6/1986 | Kawaguchi et al. | 313/509 |
| 4,613,546 | 9/1986 | Kuwata et al. | 313/509 |
| 4,672,266 | 6/1987 | Taniguchi et al. | 313/509 |

FOREIGN PATENT DOCUMENTS 59-109071  6/1984  Japan .................................... 357/17

OTHER PUBLICATIONS

Hartmann, et al, "Wide Gap . . . Materials", *Current Topics in Materials Science*, North Holland, Amster., vol. 9, 1982, pp. 270–309.

Panpove, *Electroluminescence*, Springer-Verlag 1977, N.Y., pp. 12–15.

*Primary Examiner*—Andrew J. James
*Assistant Examiner*—Jerome Jackson, Jr.
*Attorney, Agent, or Firm*—Flehr, Hohbach, Test, Albritton & Herbert

[57] ABSTRACT

An improved ZnS blue light emitting device is formed with a low-resistivity ZnS layer serving as a luminescent layer, a high-resistivity insulating layer of multilayer structure for hole carrying injection above the low-resistivity ZnS layer and an electrode on the high-resistivity insulating layer. The high-resistivity insulating layer includes at least two stacked layers of different insulator materials serving different functions.

7 Claims, 1 Drawing Sheet

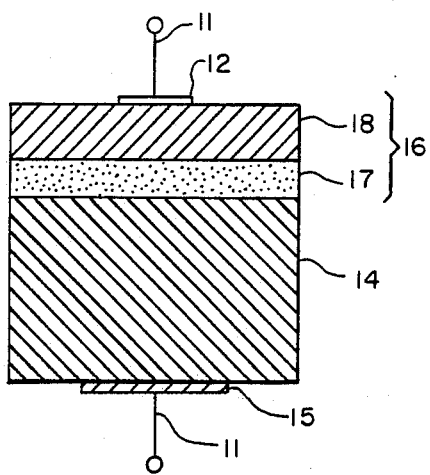
FIG.—1
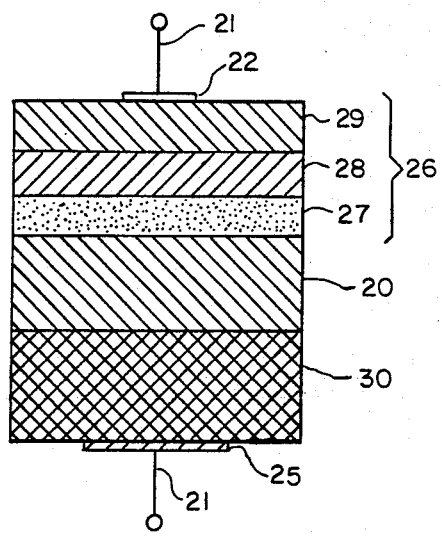
FIG.—2
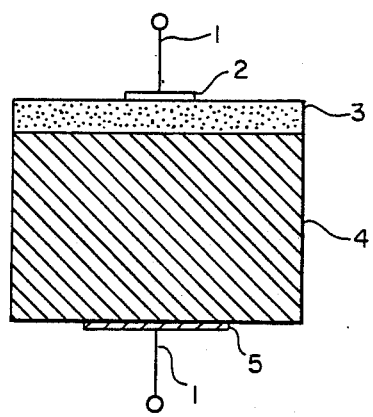
(PRIOR ART)
FIG.—3

ZNS BLUE LIGHT EMITTING DEVICE

This is a continuation of application Ser. No. 002,802 filed Jan. 13, 1987, now abandoned.

BACKGROUND OF THE INVENTION

This invention relates to a ZnS blue light emitting device of metal-insulator-semiconductor (MIS) structure having low-resistivity ZnS as luminescent layer and two or more composite insulating layers forming a high-resistivity layer for hole injection.

ZnS is a II-VI compound semiconductor with a band gap of 3.7 eV of direct transition type at room temperature and, like GaN, SiC and ZnSe, has been a subject of many researches as a highly efficient blue light emitting material. Monocrystalline ZnS grown by a method of high-pressure melting, sublimation or halogen transport is thermally processed in molten zinc at 850°–1050° C. after dopants such as Al or I are added and becomes low-resistivity n-type ($\sim 1$ ohm-cm) with luminescence peak at 450–480 nm. Since p-type ZnS has not been obtained, use is currently made of light-emitting devices of MIS structure.

FIG. 3 shows a conventional light emitting device of MIS structure with a high-resistivity layer (I-layer) 3 formed on top of a low-resistivity ZnS layer (S-layer) 4 for hole carrier injection and an injection side electrode (M-layer) 2 further on top. An ohmic contact 5 is provided to the low-resistivity ZnS layer 4 and lead lines 1,1 are attached to the electrodes 2 and 5. The high-resistivity layer 3 may be an insulating layer formed by thermal processing of the low-resistivity layer 4, an insulating layer deposited by vapor deposition method or a high-resistivity ZnS layer formed by MOCVD (organic metal chemical vapor deposition) method. External quantum efficiencies of light emission as high as 0.08% have been reported.

With conventional light emitting devices of MIS structure, the I-layer 3 always consists of a single high-resistivity layer. Because of difficulties related to the characteristics of this layer controlling the properties of the device, its layer thickness, flatness, stability, etc., problems of stable operation of a light emitting device and its radiation efficiency have not been solved satisfactorily.

SUMMARY OF THE INVENTION

It is therefore an object of the present invention to provide a highly efficient ZnS blue light emitting device of MIS structure capable of stable injection luminescence.

The above and other objects of the present invention are achieved by providing a ZnS blue light emitting device comprising a low-resistivity ZnS layer as its luminescent layer, a high-resistivity insulating layer for hole carrier injection with two or more layers of different insulating compounds deposited on this low-resistivity ZnS layer, and an electrode formed on this high-resistivity insulating layer. In summary, the ZnS blue light emitting device of MIS structure according to this invention is characterized as having a composite of two or more layers as its high-resistivity insulating layer. The first of these layers in contact with the low-resistivity ZnS layer is so formed as to be able to efficiently realize the characteristics of the light emitting element and the other layers is formed to protect the first layer and to stabilize the operation of the device.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is a schematic diagram showing the structure of a ZnS blue light emitting device according to the present invention, FIG. 2 is a schematic diagram showing the structure of another ZnS blue light emitting device according to the present invention, and FIG. 3 is a schematic diagram showing the structure of a conventional ZnS blue light emitting device.

DETAILED DESCRIPTION OF THE INVENTION

A ZnS light emitting device of MIS structure embodying the present invention has as its I-layer an insulating layer of multi-layered structure with two or more types of insulating materials sequentially formed on a cleaved surface of its low-resistivity ZnS layer (S-layer) or any surface which has been cut, polished and then stabilized. More in particular, its low-resistivity ZnS layer may be a small pellet wafer cut from a ZnS bulk single crystal grown by a high-pressure melting method, a sublimation method or a halogen transport method, a ZnS layer deposited by a molecular beam epitaxial (MBE) growth method or a MOCVD growth method, or a ZnS layer comprising a homoepitaxial layer or a heteroepitaxial layer. On this layer is a composite high-resistivity layer of total thickness 5–100 nm formed by combining two or more of the following: high-resistivity ZnS, insulators such as high-resistivity ZnO, $Al_2O_3$, SiO, $SiO_2$, $Ta_2O_5$, $ZrO_2$, $TiO_2$, $Nb_2O_3$, $Y_2O_3$, BaO, BaS, CaS, CrS, $B_2O_3$, $B_2S_3$, LiF, KF, NaS, NaI, $GaF_2$, $MgF_2$, $MnF_2$, KCl, NaCl, KBr, NaBr, $CaBr_2$, CsI, $Si_3N_4$, BeO, BeS, BeSe and BeTe, and their mixtures. The first insulating layer adjacent to the S-layer is formed with its thickness and other characteristics carefully controlled such that the properties as injection layer will be well maintained. The thickness and other properties of the second and other insulating layers are appropriately selected so as to optimize the shape, the refractive index and stability of the device.

With reference to FIG. 1, which shows the structure of a device embodying the present invention, numeral 14 indicates a ZnS layer serving as its light emitting layer which may be a monocrystalline pellet of about 5 ohm-cm obtained by processing monocrystalline ZnS grown by a high-pressure melting method or a sublimation method for 100 hours in molten Zn, Al at 1000° C., or a low-resistivity ZnS monocrystalline pellet of about 1 ohm-cm obtained by thermally processing monocrystalline ZnS grown by a halogen transport method (such as an iodine transport method) for 100 hours in molten Zn at 950° C. On a cleaved surface thereof or any surface thereof which has been polished and chemically etched, a thin Zn film is vapor-deposited under a pressure of less than $10^{-8}$ Torr and it is thereafter heated to about 350° C. On a clean ZnS surface thus obtained after Zn is evaporated, a ZnO layer 17 of thickness 50–200 Å is deposited by a method such as MBE and MOCVD whereby a film thickness can be accurately controlled to the level of atomic layers. Thereafter, $Al_2O_3$ is deposited by a similar or sputtering method to a thickness of 100–300 Å to form a second insulating layer 18. The aforementioned ZnO layer 17 and Al$_2$O$_3$ layer 18 constitute a composite insulating layer 16 on which an electrode 12 with an appropriate thickness is formed by vapor deposition of Au. An ohmic electrode 15 is formed on the side of the low-resistivity ZnS layer 14 by using In—Hg, etc. Lead lines 11,11 are connected to the electrodes 12 and 15. It was experimentally ascertained that stable injection luminescence could be maintained by a device thus constructed.

With reference next to FIG. 2, which shows the structure of another device embodying the present invention, numeral 20 indicates a luminescent layer which may be a low-resistivity ZnS substrate of the type described above with reference to FIG. 1, a low-resistivity n-type ZnS 20 drawn on the substrate of GaAs, GaP, Si or the like, or a low-resistivity ZnS layer 20 deposited or epitaxially grown on a conductive substrate 30 such as In$_2$O$_3$. On this layer is formed a composite insulating layer 26 with a high-resistivity ZnS (ZnO) or Al$_2$O$_3$ layer 27 as high-resistivity injection layer, a second high-resistivity layer 28 for maintaining insulation and a third layer 29 of ZnO (Al$_2$O$_3$) or SiO$_2$ (Si$_3$N$_4$). Metallic electrodes 22 and 25 and lead lines 21, 21 are similarly formed as described in connection with FIG. 1. It was experimentally ascertained that stable injection luminescence could be maintained also by a device of this structure.

In summary, the present invention provides a ZnS blue light emitting device of MIS structure with an improved I-layer. Previously, single insulating layers were used as the I-layer of a MIS structure and hence could not simultaneously serve as a well controlled carrier injection layer and as an insulating layer for stably maintaining the boundary surface of the injection layer. According to the present invention, the I-layer is of a multi-layered structure. The first (injection) layer is formed with its thickness and other properties stringently controlled such that its characteristics as an injection layer are properly maintained. The other insulating layers serve to protect this injection layer and their thicknesses and other properties can be appropriately selected for attaining an optimum result for the device.

The foregoing description of preferred embodiments of the invention has been presented for purposes of illustration and description. It is not intended to be exhaustive or to limit the invention to the precise form disclosed, and many modifications and variations are possible in light of the above teaching. Such modifications and variations which may be apparent to a person skilled in the art are intended to be included within the scope of this invention.

What is claimed is:

1. A ZnS blue light emitting device of metal-insulator-semiconductor structure comprising
   a low-resistivity ZnS layer serving as a luminescent layer,
   a high-resistivity insulating layer being formed on said low-resistivity ZnS layer and including two or more stacked layers of different insulating materials, said stacked layers including a first insulating layer adjacent said low-resistivity ZnS layer, said first insulating layer comprising a ZnO layer of thickness 50–200 Å, and
   an electrode formed on said high-resistivity insulating layer,
   said high-resistivity insulating layer serving as an injection layer.

2. The device of claim 1 wherein said high-resistivity insulating layer is formed on a cleaved surface of said low-resistivity ZnS layer.

3. The device of claim 1 wherein said low-resistivity ZnS layer includes a monocrystalline ZnS pellet.

4. The device of claim 1 wherein said low-resistivity ZnS layer is epitaxially grown on a conductive substrate.

5. The device of claim 1 wherein said high-resistivity insulating layer includes two or more high-resistivity insulators selected from the group which consists of ZnS, ZnO, Al$_2$O$_3$, SiO, SiO$_2$, Ta$_2$O$_5$, ZrO$_2$, TiO$_2$, Nb$_2$O$_3$, Y$_2$O$_3$, BaO, BaS, CaS, CrS, B$_2$O$_3$, B$_2$S$_3$, LiF, KF, NaS, NaI, GaF$_2$, MgF$_2$, MnF$_2$, KCl, NaCl, KBr, NaBr, CaBr$_2$, CsI, Si$_3$N$_4$, BeO, BeS, BeSe, BeTe, and their mixtures.

6. The device of claim 1 wherein said high-resistivity insulating layer has a total thickness of 5–100 nm.

7. The device of claim 1 wherein said electrode comprises vapor deposited Au.

* * * * *